(12) United States Patent
Jones-Albertus et al.

(10) Patent No.: US 8,766,087 B2
(45) Date of Patent: Jul. 1, 2014

(54) WINDOW STRUCTURE FOR SOLAR CELL

(75) Inventors: Rebecca Elizabeth Jones-Albertus, Mountain View, CA (US); Ferran Suarez-Arias, San Jose, CA (US); Michael West Wiemer, Campbell, CA (US); Michael J. Sheldon, San Jose, CA (US); Homan Yuen, Sunnyvale, CA (US)

(73) Assignee: Solar Junction Corporation, San Jose, CA (US)

( * ) Notice: Subject to any disclaimer, the term of this patent is extended or adjusted under 35 U.S.C. 154(b) by 88 days.

(21) Appl. No.: 13/104,913

(22) Filed: May 10, 2011

(65) Prior Publication Data

US 2012/0285526 A1    Nov. 15, 2012

(51) Int. Cl.
*H01L 31/0304* (2006.01)
*H01L 31/0725* (2012.01)
*H01L 31/0216* (2014.01)

(52) U.S. Cl.
CPC ...... *H01L 31/02167* (2013.01); *H01L 31/0725* (2013.01); *Y02E 10/50* (2013.01)
USPC .............................. 136/255; 136/262; 136/258

(58) Field of Classification Search
USPC ............... 136/243, 252, 258, 262; 438/57, 77
See application file for complete search history.

(56) References Cited

U.S. PATENT DOCUMENTS

| | | | |
|---|---|---|---|
| 4,404,421 A | 9/1983 | Fraas | |
| 4,881,979 A | 11/1989 | Lewis | |
| 4,935,384 A | 6/1990 | Wanlass | |
| 5,009,719 A | 4/1991 | Yoshida | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,911,839 A | 6/1999 | Tsai et al. | |
| 5,935,345 A | 8/1999 | Kuznicki | |
| 5,944,913 A | 8/1999 | Hou et al. | |
| 6,150,603 A * | 11/2000 | Karam et al. ................. | 136/252 |

(Continued)

FOREIGN PATENT DOCUMENTS

JP    63100781 A    5/1988
WO    2010/151553 A1    12/2010

(Continued)

OTHER PUBLICATIONS

Denton et al., Vegard's Law, Physical Review A, The American Physical Society, vol. 43, No. 6, pp. 3161-3164 (1991).*

(Continued)

*Primary Examiner* — Jayne Mershon
(74) *Attorney, Agent, or Firm* — Kilpatrick Townsend & Stockton LLP; Kenneth Allen; William R. Lambert

(57) ABSTRACT

A multilayer window structure for a solar cell comprises one or more layers where the bottom layer has an intrinsic material lattice spacing that is substantially the same as the emitter in the plane perpendicular to the direction of epitaxial growth. One or more upper layers of the window structure has progressively higher band gaps than the bottom layer and has intrinsic material lattice spacing is substantially different than the emitter intrinsic material lattice spacing.

17 Claims, 4 Drawing Sheets

(56) References Cited

U.S. PATENT DOCUMENTS

| | | |
|---|---|---|
| 6,252,287 B1 | 6/2001 | Kurtz et al. |
| 6,281,426 B1 | 8/2001 | Olson et al. |
| 6,340,788 B1 | 1/2002 | King et al. |
| 6,504,091 B2 | 1/2003 | Hisamatsu et al. |
| 6,617,618 B2 | 9/2003 | Sato |
| 6,660,928 B1 | 12/2003 | Patton et al. |
| 6,756,325 B2 | 6/2004 | Bour et al. |
| 6,764,926 B2 | 7/2004 | Takeuchi et al. |
| 6,765,238 B2 | 7/2004 | Chang et al. |
| 6,787,385 B2 | 9/2004 | Barber et al. |
| 6,815,736 B2 | 11/2004 | Mascarenhas |
| 6,951,819 B2 | 10/2005 | Iles et al. |
| 7,071,407 B2 | 7/2006 | Fatemi et al. |
| 7,119,271 B2 | 10/2006 | King et al. |
| 7,122,733 B2 | 10/2006 | Narayanan et al. |
| 7,122,734 B2 | 10/2006 | Fetzer et al. |
| 7,123,638 B2 | 10/2006 | Leary et al. |
| 7,126,052 B2 | 10/2006 | Fetzer et al. |
| 7,255,746 B2 | 8/2007 | Johnson et al. |
| 7,279,732 B2 | 10/2007 | Meng et al. |
| 7,709,287 B2 | 5/2010 | Fatemi et al. |
| 7,727,795 B2 | 6/2010 | Stan et al. |
| 7,807,921 B2 | 10/2010 | Fetzer et al. |
| 7,842,881 B2 | 11/2010 | Comfeld et al. |
| 8,067,687 B2 | 11/2011 | Wanlass |
| 2003/0070707 A1 | 4/2003 | King et al. |
| 2003/0145884 A1 | 8/2003 | King et al. |
| 2004/0045598 A1 | 3/2004 | Narayanan et al. |
| 2004/0200523 A1* | 10/2004 | King et al. ............... 136/262 |
| 2005/0155641 A1 | 7/2005 | Fafard |
| 2005/0274409 A1 | 12/2005 | Fetzer et al. |
| 2006/0144435 A1* | 7/2006 | Wanlass ................... 136/249 |
| 2006/0162768 A1 | 7/2006 | Wanlass et al. |
| 2007/0034853 A1 | 2/2007 | Robbins et al. |
| 2007/0131275 A1 | 6/2007 | Kinsey et al. |
| 2008/0035939 A1 | 2/2008 | Puetz et al. |
| 2008/0149173 A1 | 6/2008 | Sharps |
| 2008/0245400 A1 | 10/2008 | Li |
| 2008/0257405 A1 | 10/2008 | Sharps |
| 2009/0014061 A1 | 1/2009 | Harris et al. |
| 2009/0057721 A1 | 3/2009 | Miura et al. |
| 2009/0078310 A1 | 3/2009 | Stan et al. |
| 2009/0145476 A1 | 6/2009 | Fetzer et al. |
| 2009/0229659 A1 | 9/2009 | Wanlass et al. |
| 2009/0255576 A1 | 10/2009 | Tischler |
| 2009/0272438 A1 | 11/2009 | Cornfeld |
| 2009/0288703 A1 | 11/2009 | Stan et al. |
| 2010/0096001 A1 | 4/2010 | Sivananthan et al. |
| 2010/0180936 A1 | 7/2010 | Kim |
| 2010/0218819 A1* | 9/2010 | Farmer et al. ............ 136/256 |
| 2010/0319764 A1 | 12/2010 | Wiemer et al. |
| 2011/0023958 A1 | 2/2011 | Masson et al. |
| 2011/0114163 A1 | 5/2011 | Wiemer et al. |
| 2011/0232730 A1 | 9/2011 | Jones et al. |
| 2012/0103403 A1 | 5/2012 | Misra et al. |
| 2012/0211071 A1 | 8/2012 | Newman et al. |
| 2012/0216858 A1 | 8/2012 | Jones-Albertus et al. |
| 2012/0227797 A1 | 9/2012 | Stan et al. |
| 2013/0014815 A1 | 1/2013 | Jones-Albertus et al. |

FOREIGN PATENT DOCUMENTS

| | | |
|---|---|---|
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |

OTHER PUBLICATIONS

International Search Report and Written Opinion of the International Searching Authority for PCT Application No. PCT/US 12/36020, mailed on Aug. 14, 2012, 11 pages.
Bertness K. A. et al., "29.5%-Efficient GaInP/GaAs Tandem Solar Cells," Applied Physics Letters, vol. 65, Aug. 22, 1994, pp. 989-991.
Fewster P. F., "X-Ray Scattering From Semiconductors" Second Edition, Imperial College Press, London, 2003, Ch. 1, pp. 1-22.
Gu Y. et al., "Gas Source Growth and Doping Characteristics of AlInP on GaAs" Materials Science and Engineering B 131 (2006), pp. 49-53.
Hovel H. J., "Semiconductors and Semimetals", Academic Press, New York, 1975, Ch. 2, pp. 8-47.
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.
Cotal et al., "III-V multijunction solar cells for concentrating photovoltaics" pp. 174-192, www.rsc.org/ees, Energy and Environmental Science 2, (2009).
Ferguson et al., Nonradiative Recombination in 1.56 μm GaInNAsSb/GaNAs Quantum-Well Lasers, pp. 1-3, published online Dec. 8, 2009, Applied Physics Letters 95, 231104 (2009).
Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.
Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).
Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.
Garcia et al., Analysis of Tellurium As N-Type Dopant in GaInP: Doping, Diffusion, Memory Effect and Surfactant Properties, pp. 794-799, Journal of Crystal Growth 298 (2007).
Geelen et al., Epitaxial Lift-Off GaAs Solar Cell From a Reusable GaAs Substrate, pp. 162-171, Materials Science and Engineering B45 (1997).
Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).
Green et al., Progress in Photovoltaics: Research and Applications 19 (2011) pp. 565-572.
Green et al., Progress in Photovoltaics: Research and Applications 20 (2012) pp. 12-20.
Green, "Third Generation Photovoltaics: Advanced Solar Energy Conversion," pp. 95-109, Springer Publishing, Berlin, Germany (2003).
Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.
Harris Jr. et al., "Development of GaInNAsSballoys: Growth, band structure, optical properties and applications," 2007, Physics Status Solidi(b), vol. 244, Issue 8, pp. 2707-2729, Jul. 6, 2007.
Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.
Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.
Jackrel et al., "Dilute nitride GaInNAs and GaInNAsSb solar cells by molecular beam epitaxy", pp. 1-8, Journal of Applied Physics 101 (114916), Jun. 14, 2007.
Janotti et. al., Mutual Passivation of Electrically Active and Isovalent Impurities in Dilute Nitrides, Physical Review Letters 100, 045505 (2008).
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007.

(56) References Cited

OTHER PUBLICATIONS

Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.

Kurtz et al., "Projected Performance of Three and Four-Junction Devices Using GaAs and GaInP," pp. 875-878, 26th IEEE Photovoltaics Specialists Conference, (1997).

Merrill et al., Directions and Materials Challenges in High Performance Photovoltaics, Dec. 2007, JOM Energetic Thin Films, 59, 12, 26-30.

Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.

Miyashita et al., "Improvement of GaInNAsSb films fabricated by atomic hydrogen-assisted molecular beam epitaxy", pp. 3249-3251, Journal of Crystal Growth 311, 2009.

Ng et al., 1EV GANXAS1-X-YSBY Material for Lattice-Matched III-V Solar Cell Implementation on GAAS and GE, pp. 76-80, (2009).

Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).

Ptak et al., "Low-acceptor-Concentration GaInNAs grown by Molecular-beam Epitaxy for High-current p-i-n. solar cell applications." J. of Applied Physics, 98.094501 (2005).

Ptak et al., "Defects in GaInNAs: What We've Learned so Far" National Renewable Energy Laboratory NREL/CP-520-33555, May 2003, 7 pages.

Sabnis et al., A new roadmap for space solar cells, Industry Photovoltaics, www.compoundsemiconductor.net/csc/features-details/19735471, Aug./Sep. 2012, 5 pages.

Solar Junction Inc, "Sharp Develops Solar Cell with Word's Highest Conversion Efficiency of 35.8%" Press Release, dated Oct. 22, 2009, 3 pages.

Volz et al., Optimization of Annealing Conditions of (GaIn)(NAs) for Solar Cell Applications, pp. 2222-2228, Journal of Crystal Growth 310 (2008).

Volz et al., MOVPE growth of dilute nitride III/V semiconductors using all liquid metalorganic precursors, Journal of Crystal Growth 311 (2009), pp. 2418-2526.

Wiemer et al., "43.5% Efficient Lattice Matched Solar Cells" Proc. SPIE 810804 (2011), 5 pages.

Wistey et al., Nitrogen Plasma Optimization for High-Quality Dilute Nitrides, pp. 229-233, Journal of Crystal Growth, available online on Feb. 1, 2005 at http://www.sciencedirect.com.

Wu et al., Band Anticrossing in Highly Mismatched III-V Semiconductor Alloys, pp. 860-869, Semiconductor Science and Technology 17 (2002).

Yamaguchi et al., "Multi-junction III-V solar cells: current status and future potential", in: Solar Energy, vol. 79, issue 1, Jul. 2005.

Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).

Denton et al., Vegard's Law, Physical Review, A, The American Physical Society, vol. 43 No. 6, pp. 3161-3164 (1991).

Law et al., "Future technology pathways of terrestrial III-V multijunction solar cells for concentrator photovoltaic systems," Solar Energy Materials & Solar Cells 94 (2010) pp. 1314-1318.

International Search Report and Written Opinion PCT/US2008/008495 mailed Apr. 6, 2009, 5 pages.

International Preliminary Report on Patentability PCT/US2008/008495 dated Jan. 12, 2010, 5 pages.

International Search Report and Written Opinion corresponding to the PCT application No. PCT/US10/39534, date of mailing Sep. 8, 2010, 8 pages.

International Search Report and Written Opinion corresponding to the PCT application No. PCT/US10/56800, date of mailing Jan. 26, 2011, 8 pages.

International Search Report and Written Opinion corresponding to the PCT application No. PCT/US2010/061635, date of mailing Mar. 1, 2011, 7 pages.

International Search Report and Written Opinion corresponding to the PCT application No. PCT/US11/36486, date of mailing Aug. 25, 2011, 12 pages.

International Preliminary Report on Patentability for PCT Application No. PCT/US2010/056800, mailed on May 31, 2012, 6 pages.

International Search Report and Written Opinion of the International Searching Authority for PCT Application No. PCT/US12/25307, mailed on Aug. 16, 2012, 13 pages.

Non-Final Office Action of Jun. 10, 2010 for U.S. Appl. No. 12/217,818, 15 pages.

Final Office Action of Jan. 1, 2011 for U.S. Appl. No. 12/217,818, 15 pages.

Non-Final Office Action of Oct. 5, 2012 for U.S. Appl. No. 12/944,439, 15 pages.

Non-Final Office Action of Oct. 24, 2012 for U.S. Appl. No. 12/749,076, 17 pages.

Non-Final Office Action of Dec. 14, 2012 for U.S. Appl. No. 13/618,496, 16 pages.

Final Office Action of Feb. 6, 2013 for U.S. Appl. No. 13/618,496, 8 pages.

\* cited by examiner

WINDOW STRUCTURE FOR SOLAR CELL

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates to solar cells, as for example multijunction solar cells formed of III-V semiconductor alloys. The present invention is related to the invention set forth in provisional patent application Ser. No. 61/446,704 filed Feb. 25, 2011 and incorporates by reference the entirety of what is set forth in that application.

Solar cells typically utilize a window layer on top of an emitter to passivate the emitter surface and reflect back minority carriers to inhibit surface recombination that reduces efficiency. A window layer is part of the active semiconductor structure but may also constitute part or all of an antireflection coating. A conventional dielectric antireflection coating is understood not to be a window layer, although it may be optically coupled to or integrated into a window layer. (Additional transparent coverings may be provided for environmental protection.)

Multijunction solar cells formed primarily of III-V semiconductor alloys are known to produce solar cell efficiencies exceeding efficiencies of other types of photovoltaic materials. Such alloys are combinations of elements drawn from Columns III and V of the standard Periodic Table, identified hereinafter by their standard chemical symbols, names and abbreviations. (Those of skill in the art can identify their class of semiconductor properties by class without specific reference to their column.) The high efficiencies of these solar cells make them attractive for terrestrial concentrating photovoltaic systems and systems designed to operate in outer space. Multijunction solar cells with efficiencies above 42% under concentrations equivalent to several hundred suns have been achieved.

Historically, the highest efficiency solar cells have consisted of a monolithic stack of three subcells, grown epitaxially on germanium (Ge) or gallium arsenide (GaAs) substrates. The top subcell has active layers made of (Al)GaInP, the middle one of (In)GaAs, and the bottom subcell includes the Ge substrate or consists of a III-V material. The foregoing nomenclature for a III-V alloy, wherein a constituent element is shown parenthetically, such as Al in (Al)InGaP denotes a condition of variability in which that particular element can be zero.

Referring to FIG. 1, a conventional multijunction solar cell 10 comprises a stack of two or more subcells 12, 14, 16, which are typically connected by tunnel junctions 18, 20. Tunnel junctions 18, 20 typically comprise heavily doped n- and p-type semiconductor layers (not shown in detail) They are well known to those skilled in the art and need no further description here. FIG. 1 is a schematic cross-section showing an example of a generalized multijunction solar cell 10 with three subcells 12, 14, 16, interconnected by tunnel junctions 18, 20, with an anti-reflection coating 22 and an electrical contact layer 24 on top, and a supporting structure 26 that may be formed as a substrate or handle and back contact layer on the bottom. FIG. 1 is not drawn to scale.

As illustrated in FIG. 2 representing a structure of the prior art, each of the subcells 12, 14 and 16 comprises several associated layers, including a window layer 28, an emitter 30, a base 32 and a back surface field (BSF) structure 34. The window layer 28 and emitter layer 30 will be of one doping polarity (e.g., n-type) and the base layer 32 and back surface field layer 34 are of the opposite polarity in doping type (e.g., p-type), with a p-n or n-p junction formed between the base 32 and the emitter 30. If the base 32 contains an intrinsic region (not shown), then it may be considered a p-i-n or n-i-p junction, as is well known to those skilled in the art. The name of the given subcell is considered to be the name of the material comprising the base 32. For example, a subcell with the materials shown in FIG. 2 would be denoted an InGaP subcell.

When speaking about the stacking order of the subcells from top to bottom, the top subcell is defined to be the subcell that is closest to the light source during operation of the solar cell, and the bottom subcell is furthest from the light source. Relative terms like "above," "below," "upper," and "lower" also refer to position in the stack with respect to the light source. The order in which the subcells were grown is not relevant to this definition.

As discussed above, each conventional subcell as discussed above typically comprises a window layer, emitter, base and back surface field (BSF), and may or may not include other layers. Those skilled in the art will also recognize that subcells may also be constructed without all of the foregoing layers. The window layer and the BSF serve to reflect minority carriers from the surfaces of the emitter and base layers, respectively, and are well known to be critical to high efficiency carrier collection. The materials and doping levels used for the window layer are chosen such that the band alignment produces a large energy barrier to the minority carriers with a minimal barrier for majority carriers. This allows majority carriers to diffuse through the window layer, while minority carriers are reflected. It is important that the interface between the window layer and the emitter be very high quality, so as to minimize the minority carrier surface recombination velocity. The window layer also has a higher band gap than the adjacent emitter, in order to minimize its absorption of incident light. In subcells other than the top subcell, the band gap of the window layer may be high enough that it absorbs a negligible fraction of the light reaching that subcell. In that case, the majority of photons with energies above its band gap would have been absorbed by the upper subcell(s).

For the top subcell, however, the window layer can be a major source of current loss. The top subcell window layer absorbs a fraction of the incident light in the solar spectrum that is above its band gap and generates electron-hole pairs, or photocarriers. These photocarriers are not collected with high efficiency due to the high surface recombination velocity for minority carriers at the top of the window layer, and the low minority carrier diffusion lengths that are common in window layer materials. The window layer of lower subcells may also be a source of loss if the upper subcell(s) do not absorb all light above the band gap(s) of the active layers.

Intrinsic material lattice constants as used hereinafter are defined as the lattice constants, or lengths of the edges of the unit cell, of a freestanding crystal of the given material. Typically, lattice constants (e.g., a, b and c) are defined in 3 reference directions (e.g., x, y and z) for a given crystal structure, wherein z is the direction of growth. The given crystal structure specifies the angles between the reference directions. For cubic material such as GaAs, all three lattice constants are the same and a single intrinsic material lattice constant is typically used. In the instances of heteroepitaxy, if a semiconductor material has substantially different intrinsic material lattice constants in the plane perpendicular to the direction of growth ($a_0$ and $b_0$) than the lattice constants of the underlying layers on which is grown ($a_1$ and $b_1$), but shares the same angle between the reference directions in that plane, the material will initially adopt the lattice constants of the underlying layers. The semiconductor material is strained, and the degree of strain is proportional to the difference between its intrinsic material lattice constants and the adopted lattice constants. The strain in the plane perpendicular to the direction of growth, which may also be considered the "in-plane" strain, can be defined as, which can also be expressed as a percentage when multiplied by 100:

$$\varepsilon_{xy} = \frac{1}{2}\left(\frac{a_1 - a_0}{a_0} + \frac{b_1 - b_0}{b_0}\right)$$

The above discussion has assumed that the plane perpendicular to the direction of growth contains the x and y reference directions for the crystal structure. Because this is often not the case, such as for off-axis growth, we instead talk about the intrinsic material lattice spacing ($a_0'$ and $b_0'$) of a freestanding crystal in the plane perpendicular to the direction of growth (the x'y'-plane) compared to the lattice spacing of the underlying layers in that plane ($a_1'$ and $b_1'$). When the angles between $a_0'$ and $b_0'$, and $a_1'$ and $b_1'$, are the same, the strain in the plane perpendicular to the direction of growth is analogous to the above definition:

$$\varepsilon_{x'y'} = \frac{1}{2}\left(\frac{a_1' - a_0'}{a_0'} + \frac{b_1' - b_0'}{b_0'}\right)$$

A more complicated expression is needed when the angle between $a_0'$ and $b_0'$ is not the same as the angle between $a_1'$ and $b_1'$.

As the thickness of such a semiconductor layer with in-plane strain $\varepsilon_{xy}$ is increased, the strain energy increases until a critical thickness is reached, at which point it becomes energetically favorable to relax and relieve strain through dislocations. The critical thickness depends upon many factors, including the materials involved, the substrate and/or underlying layers, growth technique and growth conditions. Below the critical thickness, the semiconductor layer is considered pseudomorphic, or fully strained. The semiconductor layer is considered fully relaxed when sufficient dislocations have formed that the layer has been essentially restored to its intrinsic material lattice constants ($a_0$, $b_0$, and $c_0$). In general, layers may be fully strained, fully relaxed, or partially strained and partially relaxed when grown on top of a substrate or layers with substantially different lattice spacing in the plane perpendicular to the direction of growth.

For III-V multijunction solar cells based on GaAs or Ge substrates with emitters that are n-type and base layers that are p-type (i.e., "n-on-p" configuration), the top subcell typically has a window layer comprised of a single AlInP layer, with an (Al)InGaP emitter and base. $Al_{0.52}In_{0.48}P$ is the material of choice for the top window layer, as it is the III-V material with the highest direct band gap (~2.3 eV) that has substantially the same intrinsic material lattice constants as GaAs or Ge. However, $Al_{0.52}In_{0.48}P$ absorbs a significant fraction of the incident photons with energies above its direct band gap (the fraction depending on the layer thickness), and it collects the photocarriers generated by these photons with low efficiency. More than 1 mA/cm$^2$ under the AM1.5D or AM1.5G spectra may be lost (i.e., not collected) in this $Al_{0.52}In_{0.48}P$ layer.

It is advantageous to minimize the light absorbed in the window layer due to the typical low collection efficiency for photocarriers in the window layer. One approach to minimize the absorbed light in AlInP window layers has been to increase the fraction of Al in the AlInP. This results in a window layer with a higher band gap that absorbs less light and therefore transmits more light to the emitter and base of the cell, which have higher photocarrier collection efficiencies. However, this window layer has an intrinsic material lattice constant that is sufficiently different from that of the underlying layers as to produce either high levels of in-plain strain $\varepsilon_{xy}$ and/or relaxation via dislocations in the window layer.

High levels of strain or dislocations in the window layer at its interface with the emitter may increase the surface recombination velocity for minority carriers, lowering the collection efficiency in the emitter, and thus decreasing the overall efficiency of the solar cell. Thus, some of the gains in current created by increasing the fraction of Al in an AlInP window layer may be offset by an increased minority carrier surface recombination velocity. What is needed is subcell structure that decreases light absorption in the window layer while preserving a high quality window-layer/emitter interface.

SUMMARY

According to the invention, a multilayer window structure is provided that is incorporated into one or more subcells of a multijunction solar cell. The window structure may be composed of two or more layers. The bottom layer, located immediately adjacent to the emitter, has intrinsic material lattice spacing that is substantially the same as the emitter in the plane perpendicular to the direction of epitaxial growth, and has a thickness between 1-15 nm. Because the bottom layer has substantially the same intrinsic material lattice spacing as the adjacent emitter in the plane perpendicular to the direction of growth, a high quality interface between the window structure and emitter can be formed, where there is minimal minority carrier recombination. Because this bottom layer is comparatively thin, it absorbs less of the incoming light than a thicker layer would. One or more upper layers of the window structure has progressively higher band gaps than the bottom layer and has intrinsic material lattice spacing that is substantially different than the emitter intrinsic material lattice spacing. A higher band gap can be achieved by using material(s) with intrinsic material lattice spacing(s) that are different from those of the first window layer. The total thickness of the complete window structure is between 10-60 nm. Three different embodiments are disclosed: a dual layer window, a multiple-layer window where each layer has a substantially uniform intrinsic material lattice spacing, and a window formed of a nonuniform composition in which the intrinsic material lattice spacing varies continuously with depth of the window layer structure. Compared to a conventional window layer that is uniform in composition and has the same intrinsic material lattice spacing as the emitter, the multi-layer window structure decreases the light absorption in the window structure and improves the overall current collection of the subcell. While the use of layers with different intrinsic material lattice spacing may lead to strain and/or relaxation and diminished interface quality, this occurs only in the upper window layer(s) and thus does not affect the window-structure/emitter interface.

DETAILED DESCRIPTION OF THE INVENTION

Figure 3:
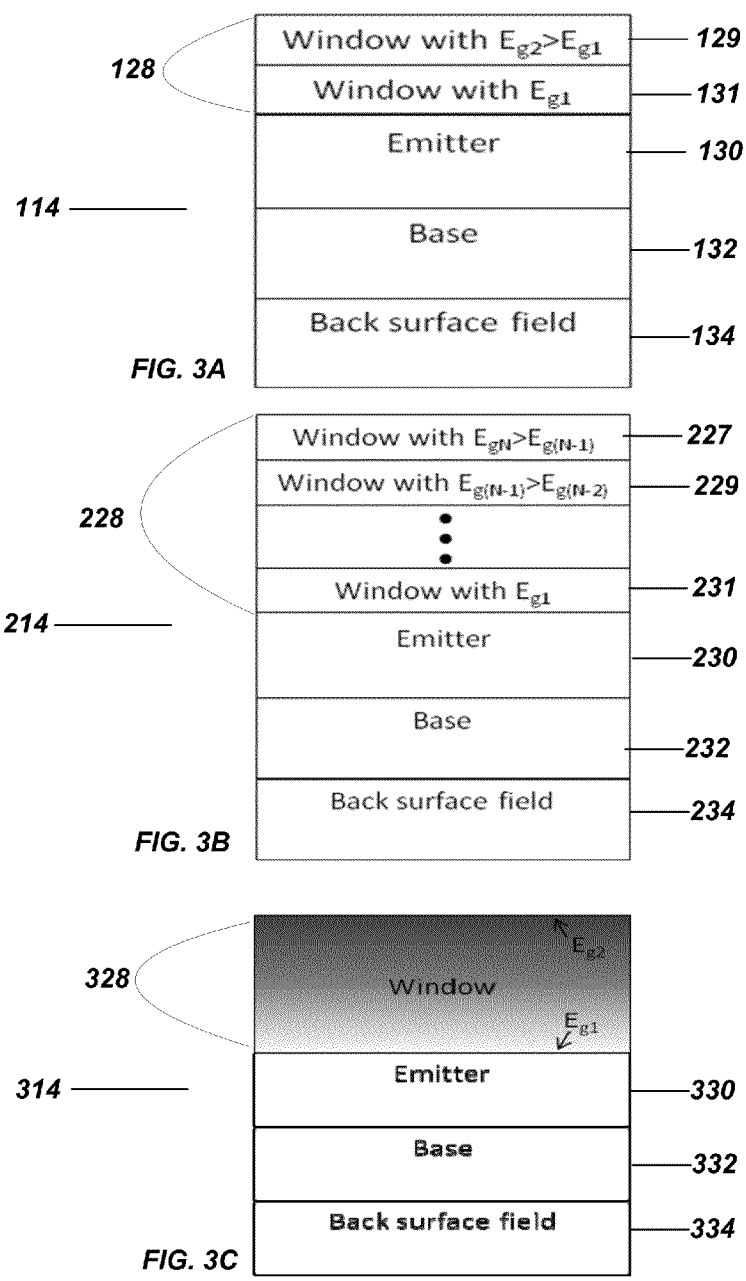
FIG. 3A is a schematic cross-section of a subcell of a multijunction solar cell illustrating a first embodiment of the invention.
FIG. 3B is a schematic cross-section of a subcell of a multijunction solar cell illustrating a second embodiment of the invention.
FIG. 3C is a schematic cross-section of a subcell of a solar cell structure illustrating a third embodiment of the invention.

The present invention relates to the window structure of the top subcell of a multijunction solar cell, as well as the window structure(s) of lower subcell(s). In one embodiment of the invention, as shown in FIG. 3A, a subcell 114 has a window structure 128 that includes two layers 129 and 131 in accordance with the invention. The lowest window layer 131 is juxtaposed to the emitter 130, has a band gap $E_{g1}$ and a thickness of 5 nm. Thicknesses between 1-15 nm may also be used. This lowest layer 131 has intrinsic material lattice spacing that is substantially the same as that of the emitter 130 and the lower subcell layers 132, 134 in the plane perpendicular to the direction of epitaxial growth. We define lattice spacings to be "substantially the same" if they differ by less than 0.3% or if the in-plane strain $\in_{xy}$ or $\in_{x'y'}$, as defined above, is less than 0.3%. We believe that in-plane strain less than 0.3% is not sufficient to degrade the surface recombination velocity at the interface between the window and the emitter. Above and directly adjacent to this lowest window layer 131 is at least one more window layer 129 that has intrinsic material lattice spacing that is substantially different from that of the emitter 130. Layer 129 has a band gap ($E_{g2}$) that is larger than band gap ($E_{g1}$) of the layer 131 immediately below it. The total thickness of the complete window structure 128 is between 10-60 nm.

FIG. 3B shows a subcell 214 according to a further embodiment of the invention where the window structure 228 is composed of N layers, where N>2. Three dots represent the window layers 2 to N-2 that are not shown expressly. The window layer 231 has a band gap ($E_{g1}$) and has intrinsic material lattice spacing that is substantially the same as the underlying emitter 230 and base 232 in the plane perpendicular to the direction of epitaxial growth. Thus, the in-plane strain in this layer 231 is minimal. The upper window layers 227, 229, etc., have intrinsic material lattice spacings that are substantially greater or less than that of the bottom emitter 230 in the plane perpendicular to the direction of epitaxial growth. The band gaps of the window layers increase in order from bottom to top, as $E_{gN} > E_{g(N-1)} > \ldots > E_{g1}$, where the band gap $E_{g1}$ is associated with the window layer 231 juxtaposed to the emitter 230.

Referring to FIG. 3C, in addition to a window structure that comprises discrete semiconductor layers, a window structure 328 might also comprise a single alloy system (e.g., InGaP or AlInP) with the composition varied across the vertical dimension of the structure 328 to modulate the band gap. At the bottom of the window structure 328, the intrinsic material lattice spacing of the alloy will be substantially the same as the adjacent emitter 330 in the plane perpendicular to the direction of epitaxial growth and the band gap $E_{g1}$ will be smallest. The band gap will increase toward the top of the window structure 328, as illustrated in FIG. 3C, where $E_{g2} > E_{g1}$. The composition may be varied across all or part of the window 328.

Figure 1:
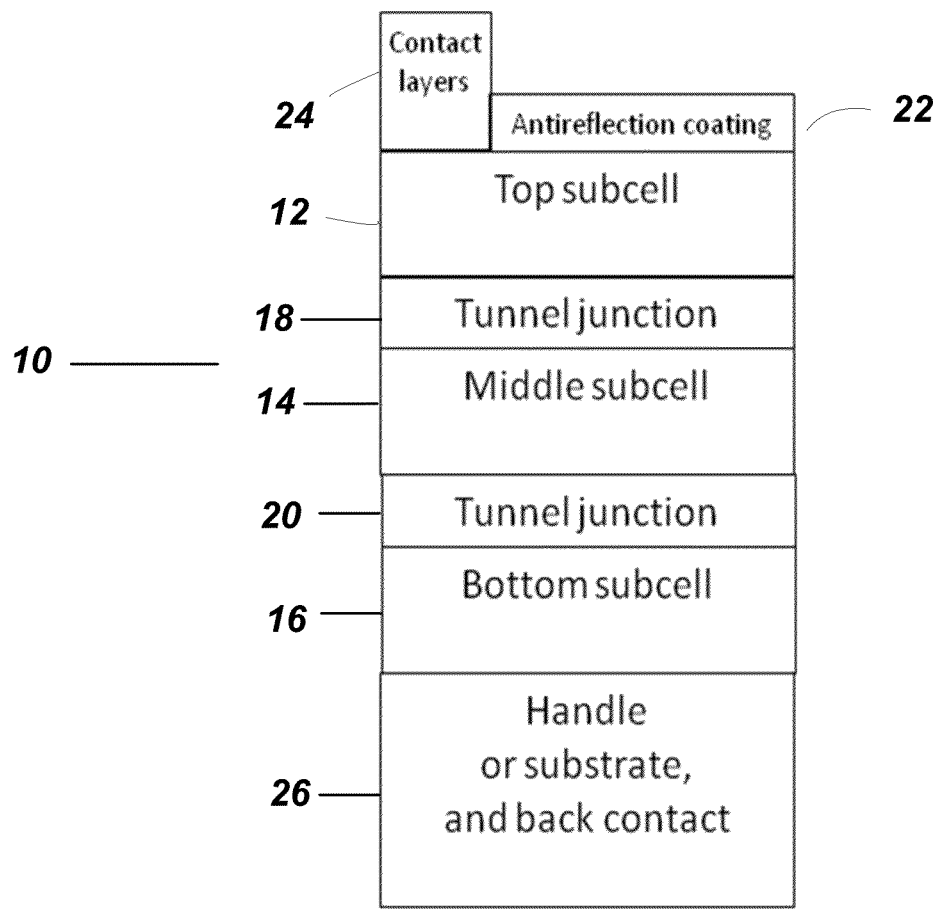
FIG. 1 is a schematic cross-section of a multijunction solar cell of the prior art.
Figure 2:
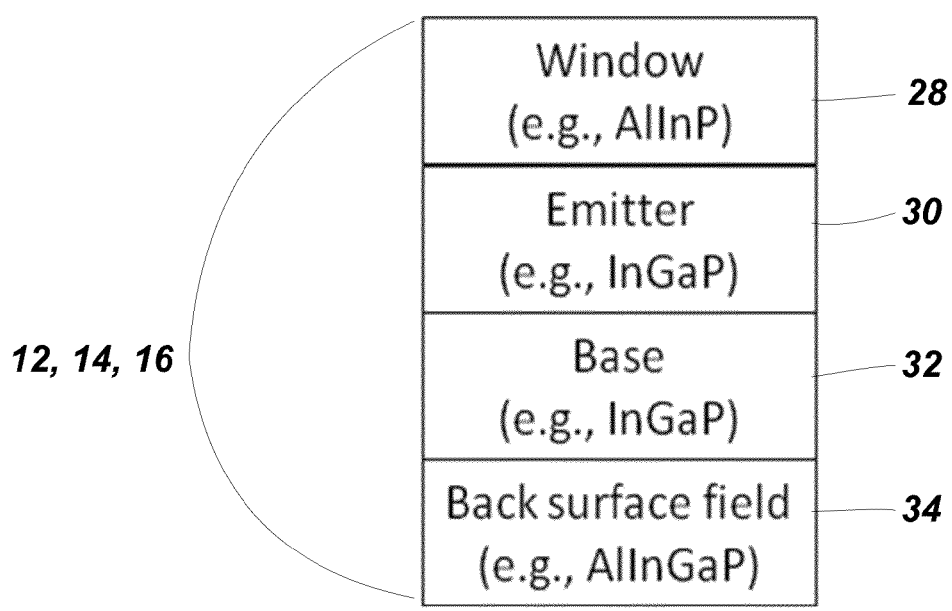
FIG. 2 is a schematic cross-section of a prior art subcell of a multijunction solar cell as herein defined.

The structures according to the invention increase the current collection in the associated subcell compared with a conventional single homogeneous window layer 28 (FIG. 2) that has substantially the same intrinsic material lattice constants as the adjacent emitter 30. The light absorbed in the window structure 128, 228, 328 according to the invention is less than the light absorbed in a conventional homogeneous single layer window structure 28. The window structure of the prior art typically has lower collection efficiency than its subcell's emitter and base layers 30, 32, due to a high recombination velocity at its top surface and inferior minority carrier lifetimes. Thus, current collection in the subcell 114, 214, 314 of the invention is improved when more light is transmitted to the emitter 130, 230, 330 and base 132, 232, 332 rather than being absorbed in the window structure.

The window structures according to the invention also may increase current collection in the subcell compared with a single window layer that has intrinsic material lattice spacing that is substantially different than that of the adjacent emitter layer. The window layer with substantially different intrinsic material lattice spacing will have significant in-plane strain and/or dislocations formed to accommodate the difference in lattice spacing. This may degrade its interface with the emitter, increasing minority carrier surface recombination velocity and degrading the subcell's performance. Such strain and defects are avoided in the invention by the lower window layer which has the same intrinsic material lattice spacing as the adjacent emitter in the plane perpendicular to the direction of growth. A low minority carrier surface recombination velocity is achieved at the emitter-window interface, which maximizes photocarrier collection from the emitter.

Figure 4:
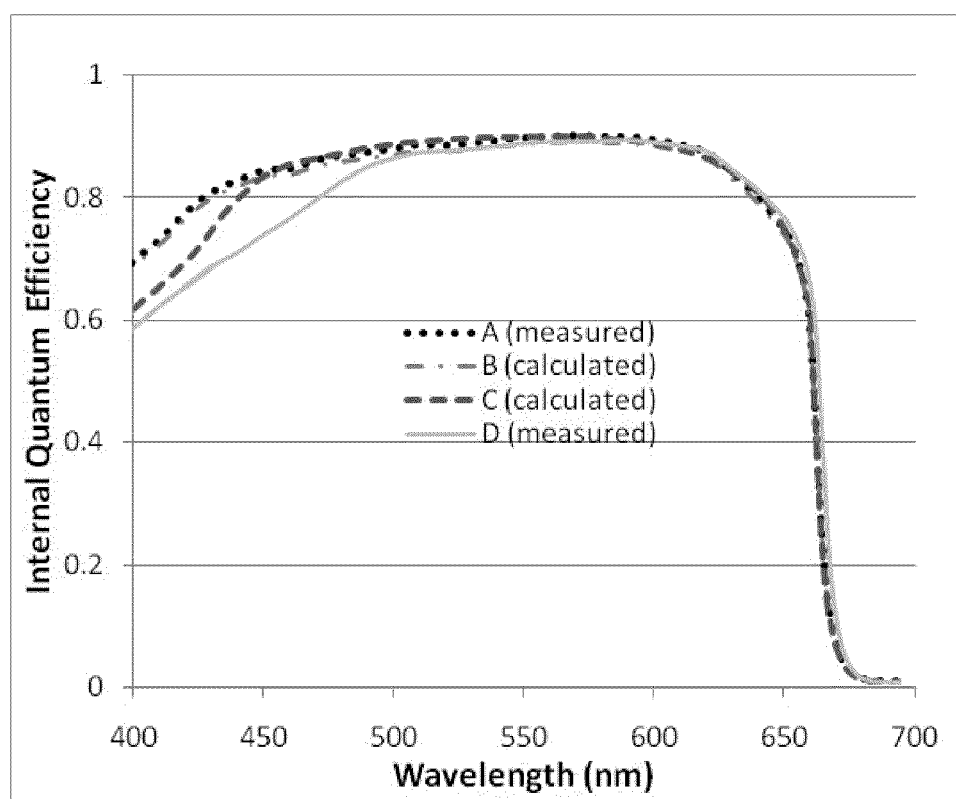
FIG. 4 graph that shows internal quantum efficiency data for InGaP top subcells of several multijunction solar cells.

FIG. 4 is a graph that shows internal quantum efficiency for InGaP subcells of multijunction solar cells A, B, C formed with subcells according to the invention, as compared with conventional InGaP subcells of a multijunction solar cell D. All of the InGaP subcells have a window structure composed of AlInP layer(s), an InGaP emitter, an InGaP base and an AlInGaP back surface field. The emitter, base and back surface fields have intrinsic material lattice constants that are substantially the same as those of the substrate, which is GaAs in this case. The solar cells with window structures according to the invention demonstrate the highest quantum efficiencies. In the embodiment of graph line A of the invention, there is a two-layer window with the top layer being 30 nm of $Al_{0.66}In_{0.34}P$ and the bottom layer being 5 nm of $Al_{0.52}In_{0.48}P$. The intrinsic material lattice spacing in the top window layer is 1.0% smaller than in the bottom window layer and the emitter in the plane perpendicular to the direction of growth, and thus the in-plane strain in this layer is 1.0%. The measured internal quantum efficiency data of the solar cell with this window structure is depicted as line A in FIG. 4. Line B depicts the expected internal quantum efficiency of a three-layer window comprising a 30 nm top layer of $Al_{0.66}In_{0.34}P$, a 2 nm middle layer of $Al_{0.60}In_{0.40}P$ and a 3 nm bottom layer of $Al_{0.52}In_{0.48}P$. Line C shows the expected internal quantum efficiency of a 35 nm window structure with the composition varied continuously from $Al_{0.70}In_{0.30}P$ at the top to $Al_{0.52}In_{0.48}P$ at the bottom, where the bottom composition has the same intrinsic material lattice spacing as the adjacent emitter. The measured internal quantum efficiency data of a solar cell with a conventional 35 nm $Al_{0.52}In_{0.48}P$ window layer, which has substantially the same intrinsic material lattice spacing as the rest of the subcell, is shown as line D. As is evident from the graph, compared to the conventional window layer structure, subcells with structures according to the invention have higher quantum efficiencies at low wavelengths, due to the decreased absorption in the window structure. The gain in current under the AM1.5D spectrum is up to 0.4 mA/cm$^2$, which gives a significant increase in solar cell efficiency.

One method for producing the window structures according to the invention is disclosed here. According to this method, growth temperatures are between 300 and 550 degrees Celsius with a growth rate of at least 0.1 microns per hour. The source materials for the window structures are of at least 99.9999% purity. Molecular beam epitaxy is used, and the background pressure of the reactor is less than $10^{-5}$ Torr. It is noted that other growth methods may also be used to produce the window structures according to the invention.

When the subcell embodying the invention is the top subcell of a multijunction solar cell, one or more of the window layers may function as part of the anti-reflection coating of the solar cell, in addition to having a function as the window of the subcell.

The solar cells according to the invention may comprise any combination of III-V, group V or II-VI materials. In one preferred embodiment of the invention, the window is formed of some combination of layers of AlInP, AlP, InGaP, AlInGaP and GaP.

The invention has been explained with reference to specific embodiments. Other embodiments will be evident to those of ordinary skill in the art. In particular, while the invention has been explained with respect to multijunction solar cells comprised of two or more subcells, it will be evident to those of ordinary skill in the art that the invention is also applicable to crystalline solar cells comprised of a single subcell. It is therefore not intended for the invention to be limited, except as indicated by the appended claims.

What is claimed is:

1. A photovoltaic cell comprising:
at least one subcell with a window structure, said at least one subcell comprising an emitter layer comprising InGaP with a first lattice spacing in the plane perpendicular to the direction of epitaxial growth;
said window structure being positioned above said emitter layer and in direct contact with said emitter layer;
said window structure having at least two window layers, a bottom window layer having an intrinsic material lattice spacing that is substantially the same as the intrinsic material lattice spacing of said emitter layer in the plane perpendicular to the direction of epitaxial growth, and at least one upper window layer overlying the bottom window layer and having a lattice spacing in the plane perpendicular to the direction of epitaxial growth that is substantially different from that of the emitter layer, wherein,
the bottom window layer is characterized by a thickness from 1 nm to 15 nm; and
the bottom window layer comprises $Al_xIn_{1-x}P$, wherein x is 0.52;
the at least one upper window layer comprises $Al_xIn_{1-x}P$, wherein x ≥0.60; and
the lattice spacing and in-plane strain of the emitter layer and the lattice spacing and in-plane strain of the bottom window layer differ by less than 0.3%; and
said at least one upper window layer having a band gap greater than a band gap of the bottom window layer.

2. The photovoltaic cell of claim 1 wherein said window structure has at least two upper window layers with intrinsic material lattice spacing differing from the intrinsic material lattice spacing of the bottom window layer in progressively increasing amounts.

3. The photovoltaic cell of claim 1 wherein a top window layer of said at least one upper window layer has a bandgap higher than a bandgap of any lower window layer.

4. The photovoltaic cell of claim 1 wherein at least a portion of said at least one upper window layer comprises an alloy characterized by a bandgap that increases continuously as a function of distance from said emitter layer.

5. The photovoltaic cell of claim 1, wherein
the at least one subcell comprises a material selected from a group III-V material, a group V material, a group II-VI material, and a combination of any of the foregoing.

6. The photovoltaic cell of claim 1, wherein the window structure is characterized by a thickness from 10 nm to 60 nm.

7. A photovoltaic cell comprising:
at least one subcell with a window structure;
the at least one subcell comprising an emitter comprising InGaP with a first lattice spacing in the plane perpendicular to the direction of epitaxial growth;
the window structure being positioned above the emitter and in direct contact with the emitter;
the window structure having at least one window layer comprising an alloy having an intrinsic material lattice spacing and a band gap that varies continuously across at least part of the window layer and wherein the intrinsic material lattice spacing of the window structure at an interface with the emitter in the plane perpendicular to the direction of epitaxial growth is substantially the same as the first lattice spacing, wherein,
the window structure is characterized by a thickness from 10 nm to 60 nm; and
the window structure is characterized by an $Al_xIn_{1-x}P$ composition wherein x is 0.52 at the interface and varies continuously to x ≥0.60; and
the lattice spacing and in-plane strain of the emitter layer and the lattice spacing and in-plane strain of the bottom window layer differ by less than 0.3%.

8. The photovoltaic cell of claim 6, wherein a bandgap at the top of the window structure is greater than a bandgap at the interface with the emitter.

9. The photovoltaic cell of claim 7, wherein
the at least one subcell comprises a material selected from a group III-V material, a group V material, a group II-VI material, and a combination of any of the foregoing.

10. A photovoltaic cell comprising at least two subcells, wherein the at least two subcells comprise an upper subcell positioned above a lower subcell, wherein the lower subcell comprises:
an emitter layer comprising InGaP and characterized by a first lattice spacing in a plane perpendicular to the direction of epitaxial growth; and
a window structure positioned above the emitter layer and in direct contact with the emitter layer;
wherein the window structure comprises at least two window layers, wherein the at least two window layers comprise a bottom window layer characterized by an intrinsic material lattice spacing that is substantially the same as the intrinsic material lattice spacing of the emitter layer in the plane perpendicular to the direction of epitaxial growth, and at least one upper window layer positioned above the bottom window layer and characterized by a lattice spacing in the plane perpendicular to the direction of epitaxial growth that is substantially different from that of the emitter layer; and wherein the at least one upper window layer is characterized by a band gap that is greater than a band gap of the bottom window layer;

the bottom window layer is characterized by a thickness from 1 nm to 15 nm;

the bottom window layer comprises $Al_xIn_{1-x}P$, wherein x is 0.52;

the at least one upper window layer comprises wherein $Al_xIn_{1-x}P$, ≥0.60; and the lattice spacing and in-plane strain of the emitter layer and the lattice spacing and in-plane strain of the bottom window layer differ by less than 0.3%.

11. The photovoltaic cell of claim 10, wherein the window structure comprises at least two upper window layers characterized by an intrinsic material lattice spacing differing from the intrinsic material lattice spacing of the bottom window layer in progressively increasing amounts.

12. The photovoltaic cell of claim 10, wherein a top window layer of the at least one upper window layer is characterized by a bandgap that is higher than a bandgap of any lower window layers.

13. The photovoltaic cell of claim 10, wherein at least a portion of the at least one upper window layer comprises an alloy characterized by a bandgap that increases continuously as a function of distance from the emitter layer.

14. The photovoltaic cell of claim 10, wherein the window structure consists of two window layers.

15. The photovoltaic cell of claim 10, wherein each of the at least two subcells comprises a material selected from a group III-V material, a group V material, a group II-VI material, and a combination of any of the foregoing.

16. A photovoltaic cell comprising:

at least two subcells, wherein the at least two subcells comprise an upper subcell positioned above a lower subcell, wherein the lower subcell comprises:

an emitter layer comprising InGaP and characterized by a first lattice spacing in a plane perpendicular to the direction of epitaxial growth; and a window structure positioned above the emitter layer and in direct contact with the emitter layer;

wherein the window structure comprises at least one window layer characterized by an intrinsic material lattice spacing and a bandgap that increases continuously as a function of distance from the emitter layer across at least part of the at least one window layer, and wherein the window structure is characterized by a thickness from 10 nm to 60 nm;

the window structure is characterized by an $Al_xIn_{1-x}P$ composition wherein x is 0.52 at the interface and varies continuously to x ≥0.60; and the lattice spacing and in-plane strain of the emitter layer and the lattice spacing and in-plane strain of the window structure differ by less than 0.3%.

17. The photovoltaic cell of claim 16, wherein each of the at least two subcells comprises a material selected from a group III-V material, a group V material, a group II-VI material, and a combination of any of the foregoing.

\* \* \* \* \*